US010768358B2

(12) United States Patent
 Gipson

(10) Patent No.: US 10,768,358 B2
(45) Date of Patent: Sep. 8, 2020

(54) PRINTED FILM WITH MOUNTED LIGHT EMITTING DIODES ENCAPSULATED IN LIGHT GUIDE

(71) Applicant: Dura Operating, LLC, Auburn Hills, MI (US)

(72) Inventor: Ron G. Gipson, Metamora, MI (US)

(73) Assignee: DURA OPERATING, LLC, Auburn Hills, MI (US)

( * ) Notice: Subject to any disclaimer, the term of this patent is extended or adjusted under 35 U.S.C. 154(b) by 230 days.

(21) Appl. No.: 15/679,548

(22) Filed: Aug. 17, 2017

(65) Prior Publication Data

US 2019/0058471 A1 Feb. 21, 2019

(51) Int. Cl.
 *G02B 6/00* (2006.01)
 *F21V 8/00* (2006.01)
 (Continued)

(52) U.S. Cl.
 CPC ...... *G02B 6/0065* (2013.01); *B29C 45/14639* (2013.01); *B29C 45/1671* (2013.01); *G02B 6/0043* (2013.01); *H04W 52/027* (2013.01); *H05K 1/189* (2013.01); *B29C 45/14655* (2013.01); *B29C 45/14754* (2013.01); *B29C 2045/1477* (2013.01);
 (Continued)

(58) Field of Classification Search
 CPC . G02B 6/0065; G02B 6/0043; H04W 52/027; B29L 2011/0075; B29C 2045/1477; B29C 2045/14131; B29C 45/14754; B29C 45/14655; B29C 45/14065; B29C 45/1671; B29C 45/14639; H05K 1/0274; H05K 2201/10106; H05K 1/189; H05K 2203/1316; H05K 2201/0108; B29K 2995/0025; B29K 2995/0026; H03K 2217/960785
 See application file for complete search history.

(56) References Cited

U.S. PATENT DOCUMENTS 9,869,810 B2    1/2018  Keranen et al.
2003/0041962 A1* 3/2003  Johnson ............... B32B 27/08
                                            156/266
(Continued)

FOREIGN PATENT DOCUMENTS

WO    2013073541 A1    5/2013
WO    2013073542 A1    5/2013
(Continued)

OTHER PUBLICATIONS

US 9,915,556 B2, 03/2018, Keränen et al. (withdrawn)

*Primary Examiner* — Y M. Quach Lee
(74) *Attorney, Agent, or Firm* — Vivacqua Crane PLLC

(57) ABSTRACT

A printed film with mounted light emitting diodes encapsulated in a light guide includes a printed film assembly. The printed film assembly includes multiple light emitting diodes. A light guide is injection molded onto a first side of the body covering the light emitting diodes. A light transmissive polymeric material coating layer is applied by injection molding to a second side of the body opposite to the first side. An overmolded component has the printed film assembly embedded therein, with the coating layer exposed for visibility of light from the light emitting diodes when at least one of the light emitting diodes is energized.

16 Claims, 3 Drawing Sheets

(51) Int. Cl.
*H04W 52/02* (2009.01)
*B29C 45/14* (2006.01)
*B29C 45/16* (2006.01)
*H05K 1/18* (2006.01)
*B29L 11/00* (2006.01)
*H05K 1/02* (2006.01)

(52) U.S. Cl.
CPC ............... *B29K 2995/0025* (2013.01); *B29K 2995/0026* (2013.01); *B29L 2011/0075* (2013.01); *H03K 2217/960785* (2013.01); *H05K 1/0274* (2013.01); *H05K 2201/0108* (2013.01); *H05K 2203/1316* (2013.01)

(56) References Cited

U.S. PATENT DOCUMENTS

| | | |
|---|---|---|
| 2005/0227036 A1 | 10/2005 | Takanashi |
| 2007/0008457 A1* | 1/2007 | Takahashi ............ G02B 6/0018 349/64 |
| 2010/0296303 A1 | 11/2010 | Sarioglu et al. |
| 2011/0037728 A1* | 2/2011 | Gourlay ............... G02B 6/0043 200/600 |
| 2013/0083533 A1* | 4/2013 | Janik ..................... F21K 9/90 362/249.02 |
| 2013/0176746 A1* | 7/2013 | Nishimura ............. H05K 1/189 362/382 |
| 2013/0234171 A1 | 9/2013 | Heikkinen et al. |
| 2015/0111328 A1 | 4/2015 | Huang et al. |
| 2015/0257278 A1 | 9/2015 | Niskala et al. |
| 2015/0307035 A1 | 10/2015 | Gerndorf et al. |
| 2016/0295702 A1 | 10/2016 | Heikkinen et al. |
| 2016/0345437 A1 | 11/2016 | Heikkinen et al. |
| 2018/0162026 A1* | 6/2018 | Stvartak .............. B29C 45/0001 |

FOREIGN PATENT DOCUMENTS

| | | |
|---|---|---|
| WO | 2017178701 A1 | 10/2017 |
| WO | 2017178702 A1 | 10/2017 |
| WO | 2017178703 A1 | 10/2017 |
| WO | 2018100243 A2 | 6/2018 |

\* cited by examiner

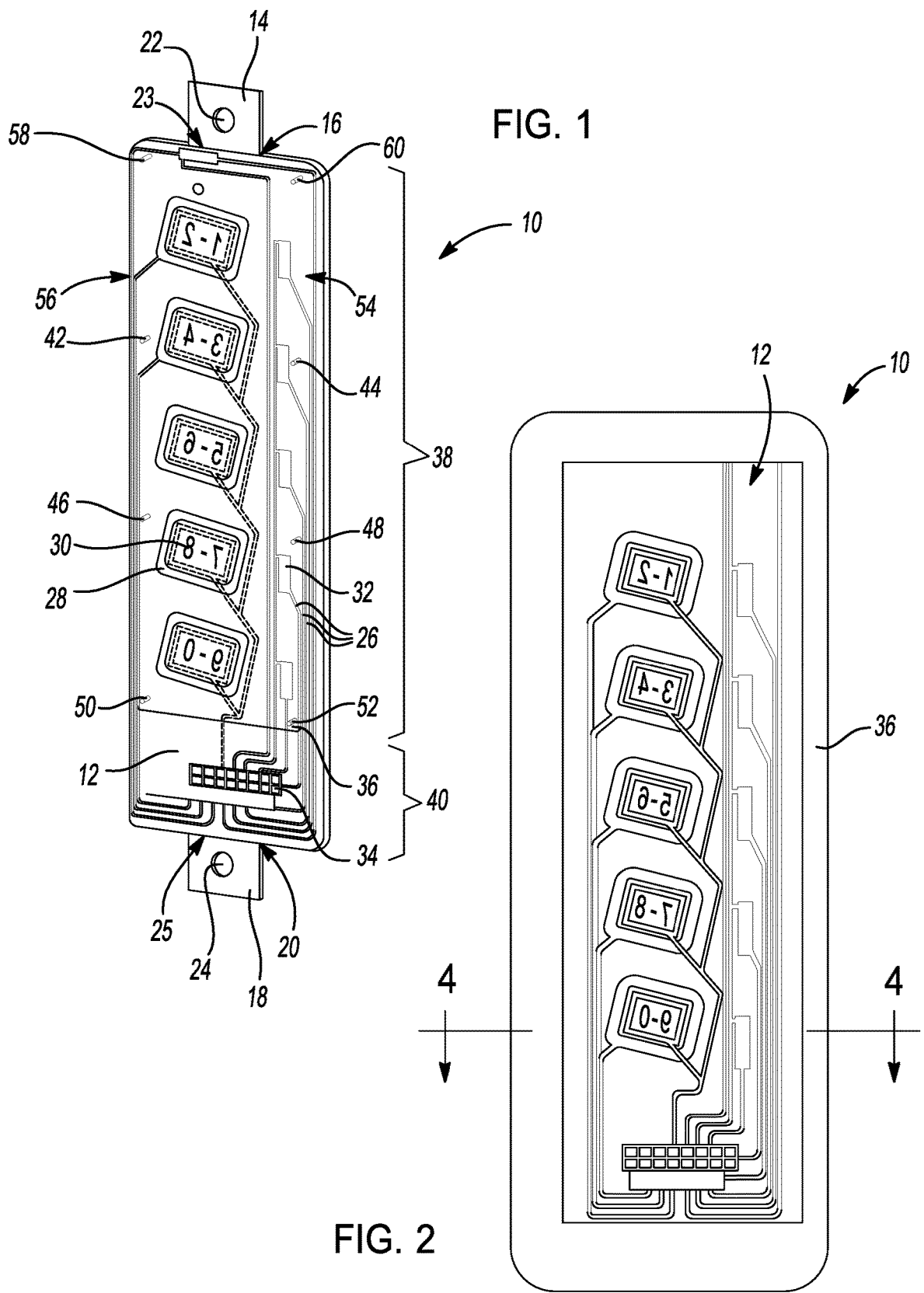

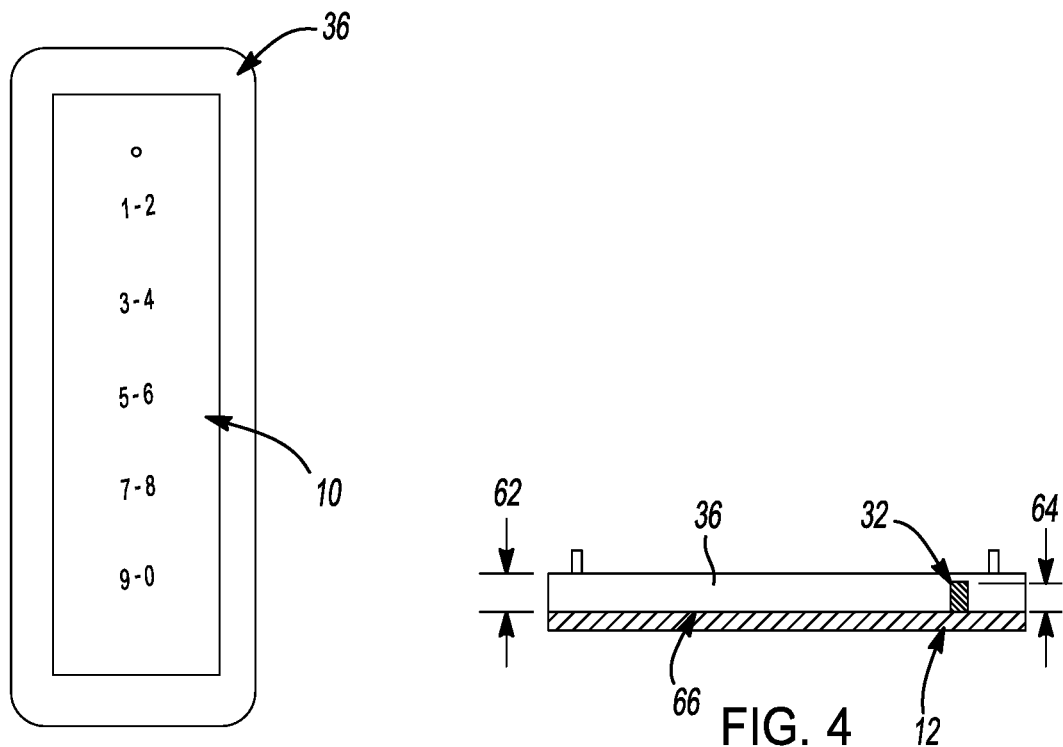
FIG. 3
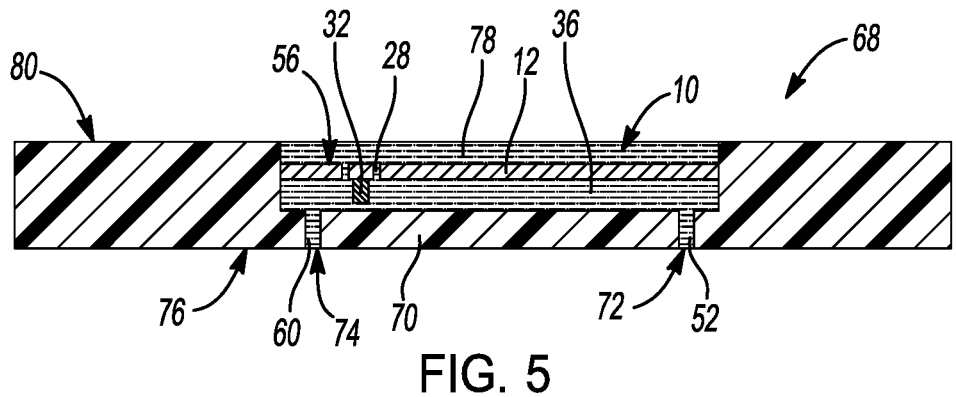
FIG. 4
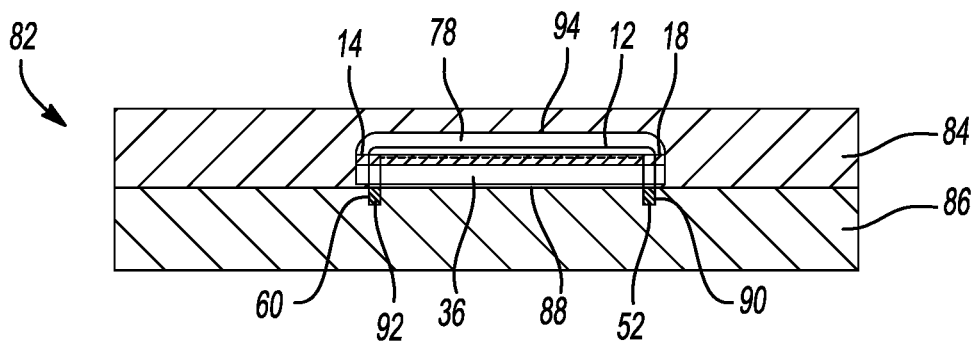
FIG. 5
FIG. 6

PRINTED FILM WITH MOUNTED LIGHT EMITTING DIODES ENCAPSULATED IN LIGHT GUIDE

FIELD

The present disclosure relates generally to capacitive touch activated light emitting diodes in a printed film and a method for encapsulating light emitting diodes with a printed film in a light guide for automotive applications.

BACKGROUND

The statements in this section merely provide background information related to the present disclosure and may or may not constitute prior art.

Electronic assemblies with backlit visual elements may be manufactured via several processes. Most commonly, a plastic part is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, and then insert the formed film into an injection mold having substantially the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronic components may also be printed onto a film. The film is then inserted into an injection mold, where plastic is molded onto the film, the electronic components being embedded in the molded plastic so that when the plastic part is removed from the mold the film is peeled away from the plastic part, leaving the electronic components embedded in or adhered to the surface of the plastic part. Using the latter method, only passive electronic components such as components that receive or transmit a signal without human interaction, including antennae, without requiring a power source, have been incorporated into injection-molded parts. Conversely, active components including components that emit light, sound, or vibration, respond to touch, or otherwise require human interaction and require a power source are not known to have been incorporated into injection-molded parts by this method.

Thus, while current printed film assemblies achieve their intended purpose, there is a need for a new and improved system and method for printing film assemblies having light emitting diodes encapsulated in a light guide.

SUMMARY

According to several aspects, a printed film with mounted light emitting diodes encapsulated in a light guide includes a printed film assembly. The printed film assembly includes a body having multiple light emitting diodes. A light guide is injection molded onto a first side of the body covering the light emitting diodes. A light transmissive polymeric material coating layer is applied by injection molding to a second side of the body opposite to the first side. An overmolded component has the printed film assembly embedded therein, with the coating layer exposed for visibility of light from the light emitting diodes when at least one of the light emitting diodes is energized.

In another aspect of the present disclosure, the body includes a first end tab extending integrally from the body at a first end of the body, and an oppositely directed second end tab extending integrally from the body at a second end of the body.

In another aspect of the present disclosure, each of the first end tab and the second end tab include an aperture.

In another aspect of the present disclosure, each of the first end tab and the second end tab are connected to the body by a frangible joint.

In another aspect of the present disclosure, multiple electrical traces of a silver ink printed onto the body and connected to the light emitting diodes.

In another aspect of the present disclosure, the body includes multiple light transmissive window frames connected to the electrical traces.

In another aspect of the present disclosure, each of the light transmissive window frames includes a set of light transmissive number pairs electrically connected to its associated light transmissive window frame and to the electrical traces.

In another aspect of the present disclosure, the light guide is overmolded onto the body in a first region and is omitted in a second region containing a terminal allowing electrical connections to be made to the terminal.

In another aspect of the present disclosure, the light guide defines a PMMA material and the overmolded component defines an acrylonitrile butadiene styrene material.

In another aspect of the present disclosure, the overmolded component is substantially non-light-transmissive.

According to several aspects, a printed film with mounted light emitting diodes encapsulated in a light guide includes a printed film assembly. The printed film assembly includes a body having electrical traces connected to multiple light emitting diodes, and oppositely directed first and second end tabs extending integrally from the body. A light guide is injection molded onto a first side of the body covering the light emitting diodes, the light guide having multiple pins integrally connected to the light guide and extending in a direction away from the body. A light transmissive polymeric material coating layer is applied by injection molding to a second side of the body opposite to the first side.

In another aspect of the present disclosure, the multiple pins of the light guide define first pins having a first length and second pins defining a second length longer than the first length.

In another aspect of the present disclosure, a substantially non-light-transmissive overmolded component has the printed film assembly embedded therein after removal of the first and second end tabs. A set of light transmissive number pairs is positioned proximate to each of the light emitting diodes, with the coating layer exposed for visibility of the number pairs when at least one of the light emitting diodes is energized, and having at least one of the multiple pins extending at least partially into the overmolded component.

In another aspect of the present disclosure, the body includes multiple light transmissive window frames with one of the light transmissive number pairs positioned within each of the window frames.

In another aspect of the present disclosure, the second pins extend outwardly of the overmolded component in an as-molded condition.

In another aspect of the present disclosure, the light guide is embedded in the substantially non-light-transmissive overmolded component.

In another aspect of the present disclosure, the electrical traces define a silver ink printed onto the body.

According to several aspects, a method for encapsulating light emitting diodes with a printed film in a light guide, comprising the steps of: connecting multiple light emitting diodes to multiple electrical traces on a body; injection molding a light guide onto a first side of the body covering the light emitting diodes to create a printed film assembly; integrally connecting multiple pins to the light guide during the injection molding step each extending in a direction away from the body; and applying a light transmissive polymeric material coating layer by injection molding to a second side of the body opposite to the first side.

In another aspect of the present disclosure, the method further includes: connecting a set of light transmissive number pairs to the multiple electrical traces on a body; and positioning the multiple light emitting diodes on the body each proximate to one of the number pairs.

In another aspect of the present disclosure, the method further includes: positioning the printed film assembly into a mold having the multiple pins contacting an internal surface of the mold such that the multiple pins create a cavity between the printed film assembly and the internal surface; and injecting a substantially non-light-transmissive material into the mold to embed the printed film assembly into the non-light-transmissive material, leaving the coating layer exposed for visibility of the number pairs when at least one of the light emitting diodes is energized, including injecting a portion of the light-transmissive material into the cavity between the printed film assembly and the internal surface.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 1 is a top left perspective view of a printed film assembly according to an exemplary aspect;

FIG. 2 is a bottom plan view of a completed printed film assembly of FIG. 1;

FIG. 3 is a top plan view of the printed film assembly of FIG. 1;

FIG. 4 is a cross sectional end elevational view taken at section 4 of FIG. 2; and FIG. 5 is a cross sectional end elevational view of the printed film assembly of FIG. 1 after addition of a coating layer and after embedding the printed film assembly in a non-light-transmissive overmolded component;

FIG. 6 is a cross sectional end elevational view of the printed film assembly of FIG. 1 positioned within a mold prior to injection of the coating layer;

DETAILED DESCRIPTION

Figure 7:
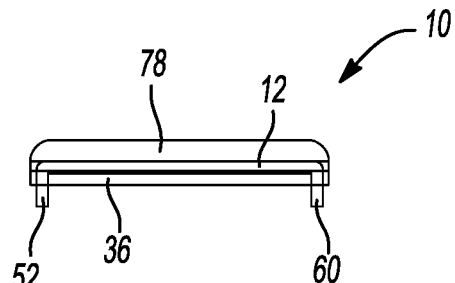
FIG. 7 is an end elevational view of the printed film assembly with the coating layer after removal from the mold of FIG. 6.
Figure 8:
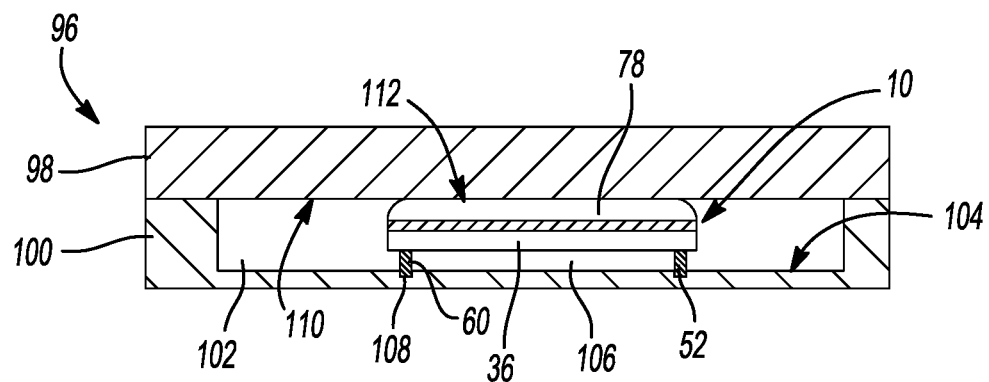
FIG. 8 is a cross sectional end elevational view of the printed film assembly coating layer of FIG. 7 positioned in a second mold prior to insertion of a non-light-transmissive overmolded component.
Figure 9:
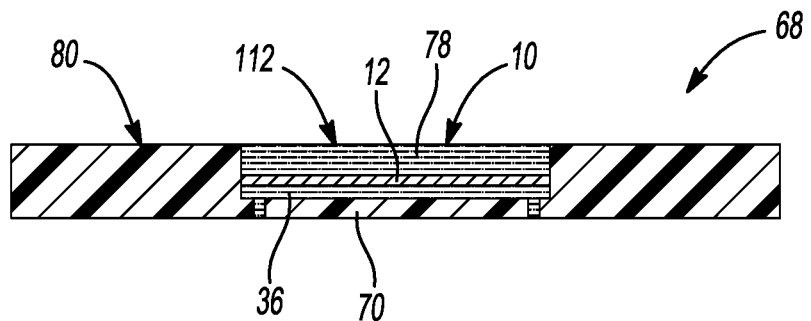
FIG. 9 is a cross sectional end elevational view similar to FIG. 5.

The following description is merely exemplary in nature and is not intended to limit the present disclosure, application, or uses.

Referring to FIG. 1, a printed film assembly 10 includes a body 12 of a flexible polymeric material. A first end tab 14 extends integrally from the body 12 at a first end 16 of the body 12, and an oppositely directed second end tab 18 extends integrally from the body 12 at a second end 20 of the body 12. The first end tab 14 and the second end tab 18 each include an aperture 22, 24 which receive pins (not shown) of an injection mold to retain the body 12 during subsequent injection molding of material onto the body 12. Each of the first end tab 14 and the second end tab 18 can be connected to the body 12 by a frangible joint 23, 25 to permit removal of the first end tab 14 and the second end tab 18. Multiple electrical traces 26 are printed onto the body 12, connected to multiple light transmissive window frames 28 each having a set of light transmissive number pairs 30 positioned within the window frames 28. The electrical traces 26, the window frames 28 and the number pairs 30 can be formed using a silver ink printed onto the body 12. Multiple light emitting diodes (LEDs) 32 are attached to the body 12, each individually positioned proximate to one of the window frames 28 and each connected to the electrical traces 26, such that the LEDs 32 when energized by a voltage applied either to individual ones of the LEDs 32 or collectively to all of the LEDs 32 illuminate one or more of the number pairs 30. A terminal 34 can also be provided to which the electrical traces 26 are routed.

The printed film assembly 10 further includes a polymeric material such as a substantially transparent or semitransparent acrylic resin film acting as a light guide 36 overmolded onto the body 12 in a first region 38 covering the electrical traces 26, the window frame 26, the number pairs 30, and the LEDs 32. The light guide 36 may be omitted in a second region 40 containing the terminal 34 where light from the LEDs 32 is not required and to allow for electrical connections to be made to the terminal 34. A plurality of pins including a first pin 42, a second pin 44, a third pin 46, a fourth pin 48, a fifth pin 50 and a sixth pin 52 are integrally connected to the light guide 36 and extend outwardly away from a surface 54 of the light guide 36 (toward the viewer as seen in FIG. 1). The pins 42, 44, 46, 48, 50, 52 are subsequently used when the printed film assembly 10 is placed into various molds to force a front face 56 of the printed film assembly 10 against a mold face as will be described in greater detail in reference to FIGS. 6 through 10.

Additional first and second locating pins 58, 60 are also integrally connected to the light guide 36 and extend outwardly away from the surface 54 of the light guide 36. The first and second locating pins 58, 60 are longer than the pins 42, 44, 46, 48, 50, 52 and provide features to locate the printed film assembly 10 into apertures of a mold, shown in reference to FIG. 6, for application of an overmolding of a polymeric material such as an ABS material. The first and second locating pins 58, 60 may be located proximate to the first end tab 14, or may be located at any other location dictated by the mold design. The first end tab 14 and the second end tab 18 may be removed from the printed film assembly 10 after installation of the light guide 36. A coating layer discussed in reference to FIG. 5, but not visible in this view may also be applied to the front face 56 of the printed film assembly 10.

Referring to FIGS. 2 and 3, and again to FIG. 1, the material of the light guide 36 can overlap and extend outwardly from the body 12 after molding is complete. A polymeric material of the light guide 36 such as the substantially transparent or semitransparent acrylic resin material is a polymethyl methacrylate (PMMA) material.

Referring to FIG. 4 and again to FIGS. 1 through 3, a depth 62 of the light guide 36 is greater than a height 64 of the LEDs 32 so the LEDs 32 are completely covered by the material of the light guide 36. The light guide 36 also completely covers a printed ink film layer 66 defining the electrical traces 26, the window frames 26, and the number pairs 30 shown in FIG. 1. Light from the LEDs 32 is blocked in a downward direction as viewed in FIG. 4 by the non-light transparent material of the body 12.

Referring to FIG. 5 and again to FIGS. 1 through 4, an exemplary finished installation member 68 incorporates the printed film assembly 10 within a substantially opaque or non-light-transmissive overmolded component 70 made for example using an Acrylonitrile Butadiene Styrene (ABS) plastic material. The pins 42, 44, 46, 48, 50, 52, with only pin 52 shown in this view are embedded in the overmolded component 70 such that an end 72 of the pins such as pin 52 shown are substantially flush with an outer surface 76 of the overmolded component 70. The greater length first and second locating pins 58, 60, with only second locating pin 60 shown in this view, extend entirely through the material of the overmolded component 70 such that an end face 74 of the second locating pin 60 may extend past and outwardly from an outer surface 76 of the overmolded component 70 in an as-molded condition. The end face 74 can then be cut off in a separate operation to be co-planar with the outer surface 76 of the overmolded component 70. The printed film assembly 10 is oriented having the front face 56 of the printed film assembly 10 directed upward as viewed in FIG. 5 and substantially co-planar with a surface 80 of the overmolded component 70. A transparent or semitransparent and therefore substantially light transmissive polymeric material coating layer 78 is applied onto the surface 80 and onto the front face 56 of the printed film assembly 10.

When all or individual ones of the LEDs 32 are energized, light emitted into the light guide 36 is blocked by the opaque material of the overmolded component 70, but transmitted through the multiple window frames 28 each having one of the set of number pairs 30. The illuminated number pairs 30 are thereby back-lit and visible through the coating layer 78.

Referring to FIG. 6 and again to FIGS. 1 and 5, the molding processes may be performed as follows. The body 12 is placed within a first mold 82 having a first mold half 84 and a second mold half 86. The first end tab 14 and the second end tab 18 retain the body 12 in the position shown for subsequent injection molding operations. Pins (not shown) extending from either the first mold half 84 or the second mold half 86 are received in the apertures 22, 24 of the first end tab 14 and the second end tab 18. In a first molding shot the material of the light guide 36 is injected into a cavity 88 created between the body 12 and the second mold half 86. The second mold half 86 may also include multiple slots 90 which receive material of the light guide 36 to form the pins 42, 44, 46, 48, 50, 52 (only pin 52 is shown in this view), and into slots 92 which receive material of the light guide 36 to form the first and second locating pins 58, 60. In a second molding shot the material of the coating layer 78 is then injected into a cavity 94 of the first mold half 84 created between the body 12 and the first mold half 84.

Referring to FIG. 7 and again to FIG. 6, the printed film assembly 10 is shown after removal from the first mold 82. The first end tab 14 and the second end tab 18 can be removed at this time. Flashing may be trimmed from external surfaces of any of the pins 42, 44, 46, 48, 50, 52, the first and second locating pins 58, 60, the light guide 36 or the coating layer 78.

Referring to FIG. 8 and again to FIGS. 6 through 7, the printed film assembly 10 is then placed in a second mold 96 having a third mold half 98 and a fourth mold half 100, with the printed film assembly 10 located entirely within a cavity 102 of the fourth mold half 100. The pins 42, 44, 46, 48, 50, 52 directly abut a lower surface 104 of the fourth mold half 100 to define a cavity 106 between the light guide 36 and the lower surface 104. The first and second locating pins 58, 60 may be partially received in cavities 108 (only one of which is visible in this view) created in the lower surface 104. An inner surface 110 of the third mold half 98 directly abuts a surface 112 of the coating layer 78 which together with the first and second locating pins 58, 60 retain the printed film assembly 10 in the position shown for injection molding of the material of the overmolded component 70 described in reference to FIG. 5. The material of the overmolded component 70 is injected into and fills the cavity 102 of the fourth mold half 100 and the cavity 106 between the light guide 36 and the lower surface 104, thereby forming the finished installation member 68.

Referring to FIG. 9 and again to FIGS. 5 through 8, the finished installation member 68 is shown after removal from the second mold 96. According to several aspects, when the finished installation member 68 is straight as shown, the surface 112 of the coating layer 78 is substantially coplanar with the surface 80 of the overmolded component 70. If the finished installation member 68 has a curved or other geometric shape, the surface 112 of the coating layer 78 will form a substantially smooth interface with the surface 80 of the overmolded component 70.

A printed film with mounted light emitting diodes encapsulated in a light guide of the present disclosure offers several advantages. These include providing a system and method for manufacturing completely injection molded printed film assemblies having light emitting diodes encapsulated in a light guide with the printed film assembly embedded in an overmolded component. A surface of a coating layer allowing light transmission from the light emitting diodes forms a substantially smooth interface with a surface of the overmolded component.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A printed film with mounted light emitting diodes encapsulated in a light guide, comprising:
   a printed film assembly, including:
      a body having multiple light emitting diodes;
      a light guide injection molded onto a first side of the body covering the light emitting diodes;

a light transmissive polymeric material coating layer applied by injection molding to a second side of the body opposite to the first side; and an overmolded component having the printed film assembly embedded therein, with the coating layer exposed for visibility of light from the light emitting diodes when at least one of the light emitting diodes is energized, wherein the body includes a first end tab extending integrally from the body at a first end of the body, and an oppositely directed second end tab extending integrally from the body at a second end of the body and each of the first end tab and the second end tab are connected to the body by a frangible joint.

2. The printed film with mounted light emitting diodes encapsulated in a light guide of claim 1, wherein each of the first end tab and the second end tab include an aperture.

3. The printed film with mounted light emitting diodes encapsulated in a light guide of claim 1, further including multiple electrical traces of a silver ink printed onto the body and connected to the light emitting diodes.

4. The printed film with mounted light emitting diodes encapsulated in a light guide of claim 3, wherein the body includes multiple light transmissive window frames connected to the electrical traces.

5. The printed film with mounted light emitting diodes encapsulated in a light guide of claim 4, wherein each of the light transmissive window frames includes a set of light transmissive number pairs electrically connected to its associated light transmissive window frame and to the electrical traces.

6. The printed film with mounted light emitting diodes encapsulated in a light guide of claim 1, wherein the light guide is overmolded onto the body in a first region and is omitted in a second region containing a terminal allowing electrical connections to be made to the terminal.

7. The printed film with mounted light emitting diodes encapsulated in a light guide of claim 1, wherein the light guide defines a PMMA material and the overmolded component defines an acrylonitrile butadiene styrene material.

8. The printed film with mounted light emitting diodes encapsulated in a light guide of claim 7, wherein the overmolded component is substantially non-light-transmissive.

9. A printed film with mounted light emitting diodes encapsulated in a light guide, comprising:
a printed film assembly, including:
a body having electrical traces connected to multiple light emitting diodes, and oppositely directed first and second end tabs extending integrally from the body;
a light guide injection molded onto a first side of the body covering the light emitting diodes, the light guide having multiple pins integrally connected to the light guide and extending in a direction away from the body;
a light transmissive polymeric material coating layer applied by injection molding to a second side of the body opposite to the first side;
a substantially non-light-transmissive overmolded component having the printed film assembly embedded therein after removal of the first and second end tabs; and
a set of light transmissive number pairs positioned proximate to each of the light emitting diodes, with the coating layer exposed for visibility of the number pairs when at least one of the light emitting diodes is energized, and having at least one of the multiple pins extending at least partially into the overmolded component.

10. The printed film with mounted light emitting diodes encapsulated in a light guide of claim 9, wherein the multiple pins of the light guide define first pins having a first length and second pins defining a second length longer than the first length.

11. The printed film with mounted light emitting diodes encapsulated in a light guide of claim 9, wherein the body includes multiple light transmissive window frames with one of the light transmissive number pairs positioned within each of the window frames.

12. The printed film with mounted light emitting diodes encapsulated in a light guide of claim 9, wherein the second pins extend outwardly of the overmolded component in an as-molded condition.

13. The printed film with mounted light emitting diodes encapsulated in a light guide of claim 9, wherein:
the light guide is embedded in the substantially non-light-transmissive overmolded component; and
a surface of the coating layer allowing light transmission from the light emitting diodes forms a substantially smooth interface with a surface of the overmolded component.

14. The printed film with mounted light emitting diodes encapsulated in a light guide of claim 9, wherein the electrical traces define a silver ink printed onto the body.

15. A method for encapsulating light emitting diodes with a printed film in a light guide, comprising the steps of:
connecting multiple light emitting diodes to multiple electrical traces on a body;
injection molding a light guide onto a first side of the body covering the light emitting diodes to create a printed film assembly;
integrally connecting multiple pins to the light guide during the injection molding step each extending in a direction away from the body;
applying a light transmissive polymeric material coating layer by injection molding to a second side of the body opposite to the first side;
connecting a set of light transmissive number pairs to the multiple electrical traces on a body; and
positioning the multiple light emitting diodes on the body each proximate to one of the number pairs.

16. The method for encapsulating light emitting diodes with a printed film in a light guide of claim 15, further including:
positioning the printed film assembly into a mold having the multiple pins contacting an internal surface of the mold such that the multiple pins create a cavity between the printed film assembly and the internal surface; and
injecting a substantially non-light-transmissive material into the mold to embed the printed film assembly into the non-light-transmissive material, leaving the coating layer exposed for visibility of the number pairs when at least one of the light emitting diodes is energized, including injecting a portion of the light-transmissive material into the cavity between the printed film assembly and the internal surface.

* * * * *